United States Patent
Johnston et al.

(10) Patent No.: US 9,801,276 B2
(45) Date of Patent: Oct. 24, 2017

(54) METHOF OF FORMING AN INTEGRATED COMPOSITE STRUCTURE

(71) Applicant: The Boeing Company, Chicago, IL (US)

(72) Inventors: Scott R. Johnston, St. Louis, MI (US); Sergio H. Sanchez, Seattle, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/952,886

(22) Filed: Nov. 25, 2015

(65) Prior Publication Data

US 2017/0150602 A1    May 25, 2017

(51) Int. Cl.
   - *H05K 3/10* (2006.01)
   - *H05K 1/11* (2006.01)
   - *H05K 1/03* (2006.01)

(52) U.S. Cl.
   CPC .......... *H05K 1/115* (2013.01); *H05K 1/0313* (2013.01); *H05K 3/102* (2013.01); *H05K 3/103* (2013.01)

(58) Field of Classification Search
   CPC .......... A61N 1/372; A61N 1/375; H01Q 1/00; H05K 1/0313; H05K 1/115; H05K 3/102; H05K 3/103
   See application file for complete search history.

(56) References Cited

U.S. PATENT DOCUMENTS 6,103,033 A * 8/2000 Say .................... A61B 5/14532
                                                        156/238

FOREIGN PATENT DOCUMENTS

WO    2013147799 A1 * 10/2013
WO    2013163503 A1 * 10/2013

OTHER PUBLICATIONS

Sarik et al., "Combining 3D printing and printable electronics", Feb. 19-22, 2012, pp. 1-5, ISBN 978-1-4503-1174-8/12/0002, TEI 2012, Kingston, Ontario, Canada.

* cited by examiner

*Primary Examiner* — Carl Arbes
(74) *Attorney, Agent, or Firm* — Haynes and Boone, LLP

(57) ABSTRACT

A system and method according to one or more embodiments are provided to integrate circuits and/or circuit elements within a structure to form an electronically and/or physically integrated composite structure. For example, a circuit formed on a planar polymer substrate may be conformed to and electrically coupled to a forming structure in a single fabrication step. In one example, a forming structure formed and/or fabricated using an additive manufacturing process includes a contoured surface. A circuit is formed on a planar polymer substrate. The polymer substrate is deformed by environmental stress to substantially conform to the contoured surface of the forming structure and physically and/or electrically couple the circuit on the polymer substrate to a circuit formed on the forming structure. Additional systems and methods are also provided.

21 Claims, 12 Drawing Sheets

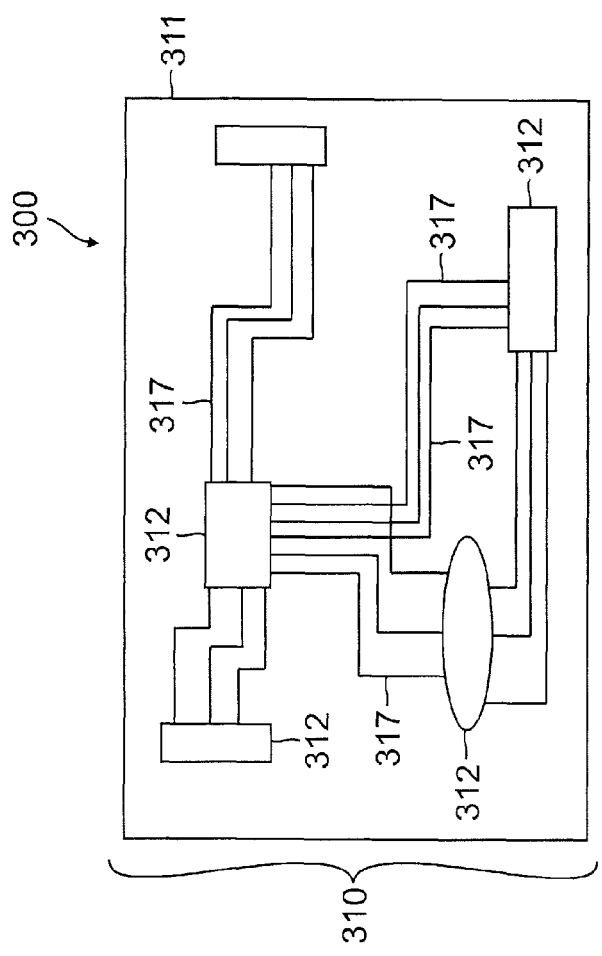
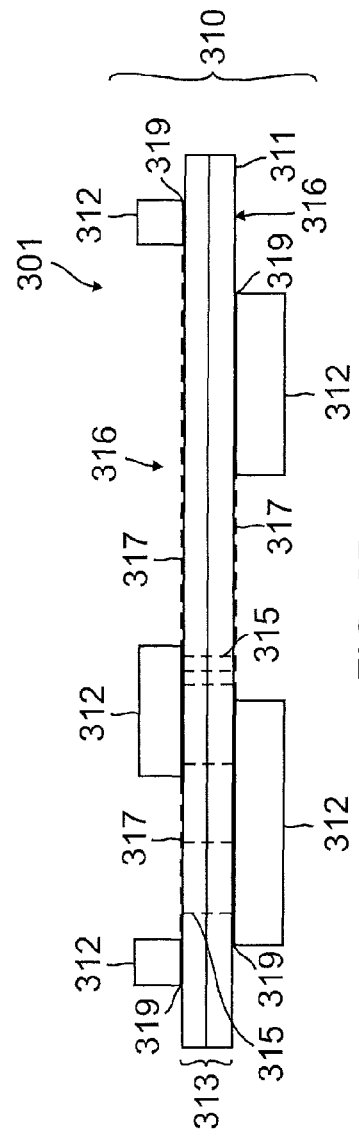
FIG. 3A
FIG. 3B

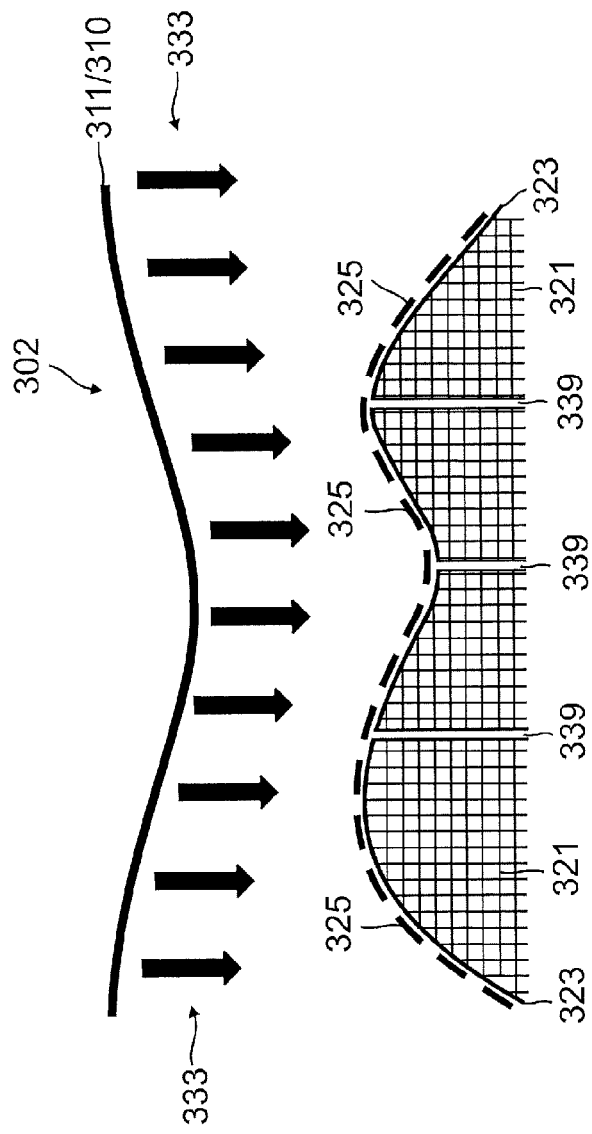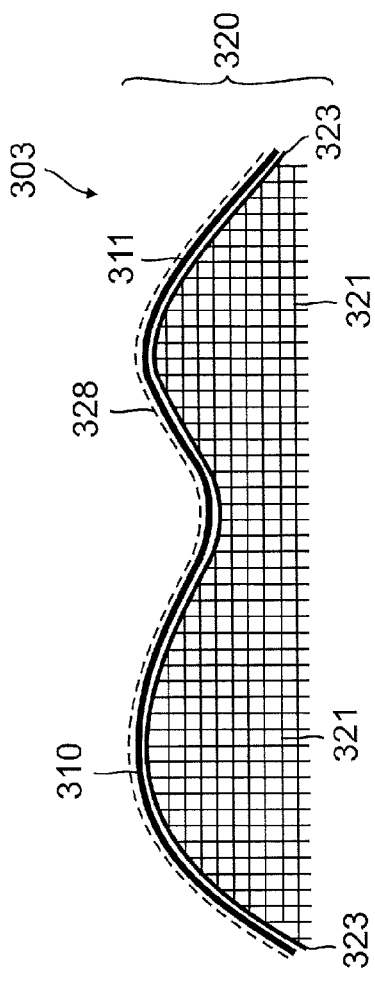
FIG. 3C
FIG. 3D

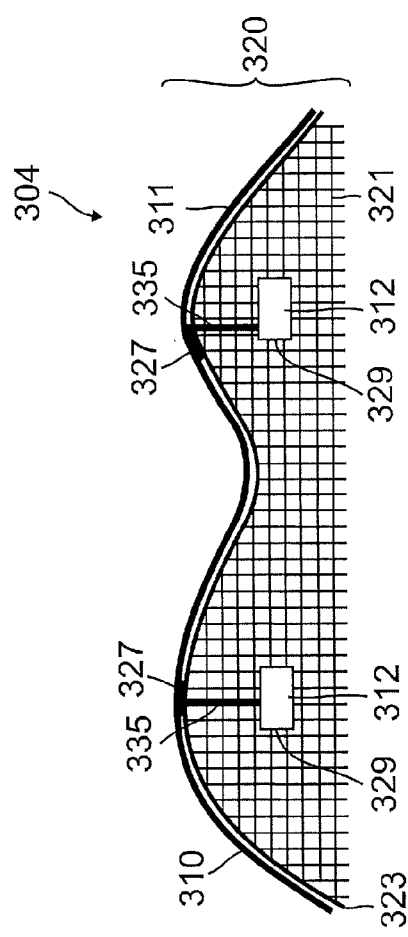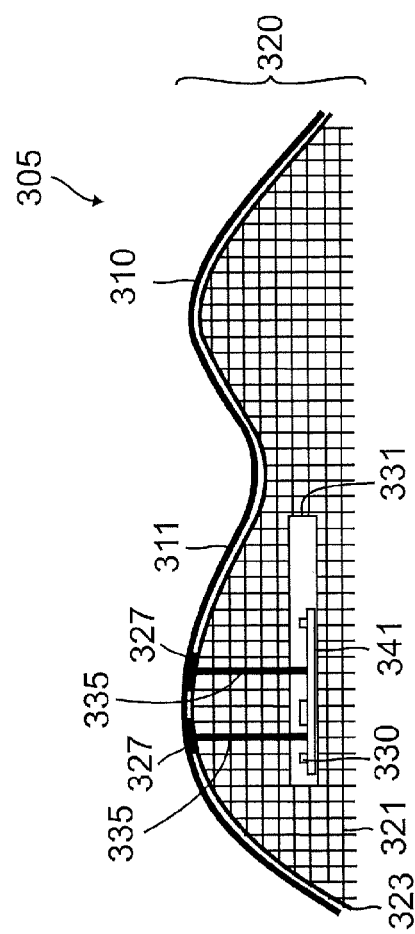
FIG. 3E
FIG. 3F

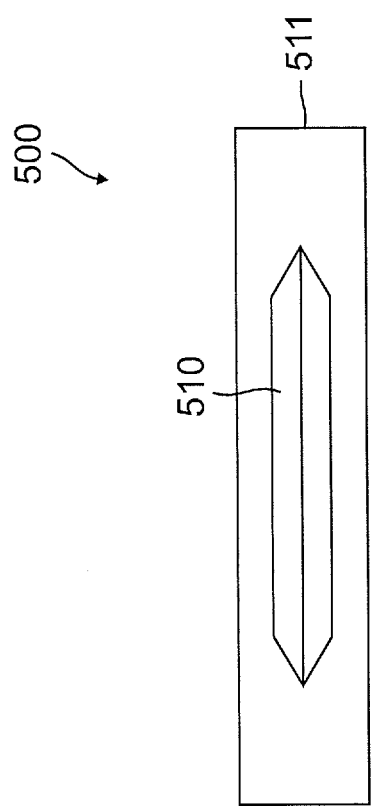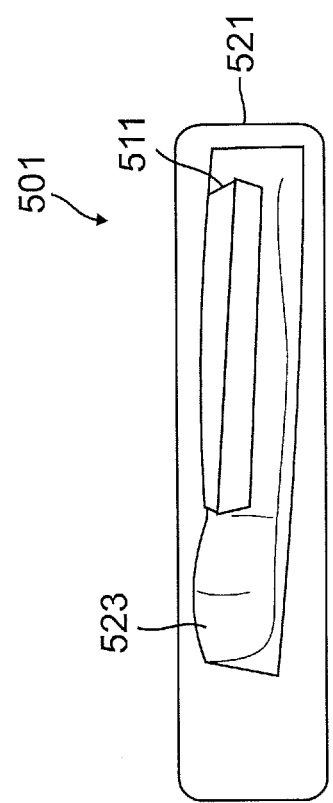
FIG. 5A
FIG. 5B

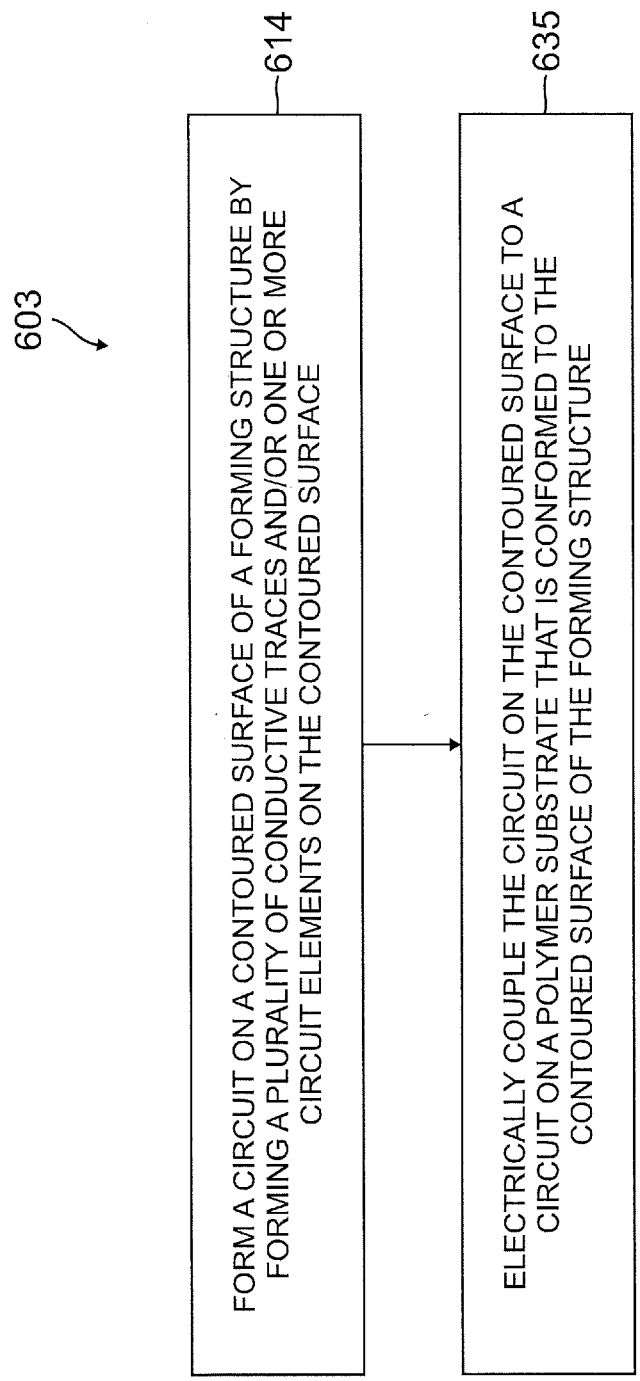

METHOF OF FORMING AN INTEGRATED COMPOSITE STRUCTURE

TECHNICAL FIELD

One or more embodiments of the invention relate generally to fabricating structures using an additive manufacturing system and more particularly, for example, to improvements in joining and bonding electronic circuits to lightweight contoured structures.

BACKGROUND

In the field of structural fabrication processes, there is an ongoing effort to reduce the number of operational steps required to fabricate structures that, in their final form, include electrical and/or electronic circuits and components. Conventional techniques rely on multiple process steps to combine circuits and components with a structure, such as power conduits and/or sensor cabling added to the wing of an aircraft. For example, a conventional planar printed circuit board (PCB) is often attached within a designated space formed within a structure only after the structure is fabricated. Such methodology can weaken the overall strength of the structure by removing material both for the designated space and for post-fabrication access to the designated space. Complex and time consuming fabrication processes and hardware may be required to combine the PCB with the structure and provide electrical connections to various components. Wear-out of such connections may negatively affect reliability and add to repair costs of the end product. Thus, there is a need for an improved methodology to efficiently and reliably combine electrical and/or electronic circuits and/or components with structures.

SUMMARY

Systems and methods are disclosed herein that provide an improved approach to combining electrical and/or electronic elements and/or circuits with contoured forming structures to form relatively lightweight and robust integrated composite structures. In some embodiments, a lightweight integrated composite structure may include a polymer substrate thermoformed to conform and adhere to a contoured surface of a lightweight forming structure. Forming structures may be formed from a wide range of materials using an additive manufacturing (AM) system, such as a binder jetting AM system, a directed energy deposition AM system, a material extrusion (e.g., fused filament fabrication) AM system, a material jetting AM system, a powder bed fusion (e.g., selective laser sintering) AM system, a sheet lamination AM system, and/or a vat photopolymerization (e.g., stereolithography) AM system. Substrates may be formed from a dielectric polymer material capable of becoming pliable and deforming without stretching and/or causing damage to an electrical circuit formed thereon.

For example, a circuit may be formed on a polymer substrate using a two dimensional printing process where conductive traces and/or circuit elements are printed on one or more surfaces of the polymer substrate. A forming structure, potentially including a complex contoured surface, may be formed using an AM system. Pressure, vacuum, and/or other environmental stress may be applied to the polymer substrate to substantially conform and/or adhere the polymer substrate to the contoured surface of the forming structure. In some embodiments, the bonding of the polymer substrate to the contoured surface may be performed in a single operation of a thermoforming process.

In various embodiments, circuit elements and/or conductive traces may be formed directly on the contoured surface of the forming structure, and a polymer substrate including additional conductive traces and/or circuit elements may be formed and bonded to the contoured surface of the forming structure and electrically coupled to the circuitry formed on the contoured surface. The thermoforming process may include operations of bonding and coupling in a single step, saving manufacturing time and expense. In some embodiments, a cavity may be formed within the forming structure to allow for embedding circuitry, which may in some embodiments be formed on a printed circuit board (e.g., a dielectric substrate). The circuitry and/or dielectric substrate may be bonded within the cavity and conductive vias formed to allow for electrical access/connection, as part of the process used to form the forming structure. The embedded circuitry may be electrically coupled to the polymer substrate during a thermoforming process including bonding a polymer substrate to a surface of the forming structure.

In one embodiment, a method includes forming a circuit on a substantially flat polymer substrate, wherein the polymer substrate is configured to deform when subjected to environmental stress; and forming an integrated composite structure by providing the environmental stress to deform the polymer substrate to substantially conform and/or adhere the polymer substrate to a contoured surface of a forming structure.

In another embodiment, a system includes a forming structure comprising a contoured surface; and a circuit formed on a polymer substrate; wherein the polymer substrate is deformed by environmental stress to substantially conform and/or adhere to the contoured surface of the forming structure to form an integrated composite structure.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

FIGS. 3A-D illustrate processes for forming a circuit on a polymer substrate and bonding the polymer substrate to a contoured surface of a forming structure in accordance with embodiments of the disclosure.

FIGS. 3E-F illustrate cross sections of circuit elements and circuits embedded within a forming structure in accordance with embodiments of the disclosure.

FIG. 5A illustrates a top view of a circuit formed on a polymer substrate in accordance with an embodiment of the disclosure.

FIG. 5B illustrates a perspective view of a polymer substrate conformed to a contoured surface of a forming structure in accordance with an embodiment of the disclosure.

FIGS. 6A-D illustrate flow diagrams describing various processes for forming an integrated composite structure in accordance with embodiments of the disclosure.

Embodiments of the invention and their advantages are best understood by referring to the detailed description that follows. It should be appreciated that like reference numerals are used to identify like elements illustrated in one or more of the figures.

DETAILED DESCRIPTION

Typically, a structure and circuitry to be combined with the structure are fabricated independently and combined during a series of manual assembly steps. Additional assembly steps include bonding components to the structure, attaching printed circuit boards to the structure, and fabricating and attaching wire harnesses between circuits and electrical components, which requires manufacturing time and resources. Embodiments of the present disclosure provide an efficient and flexible method to combine circuitry with structure to form an integrated composite structure, which can in turn be used to provide cost effective and reliable components for larger assemblies that benefit from lightweight and/or smart electronics integration, such as unmanned or manned aerial, terrestrial, and/or aquatic vehicles, for example.

Figure 1:
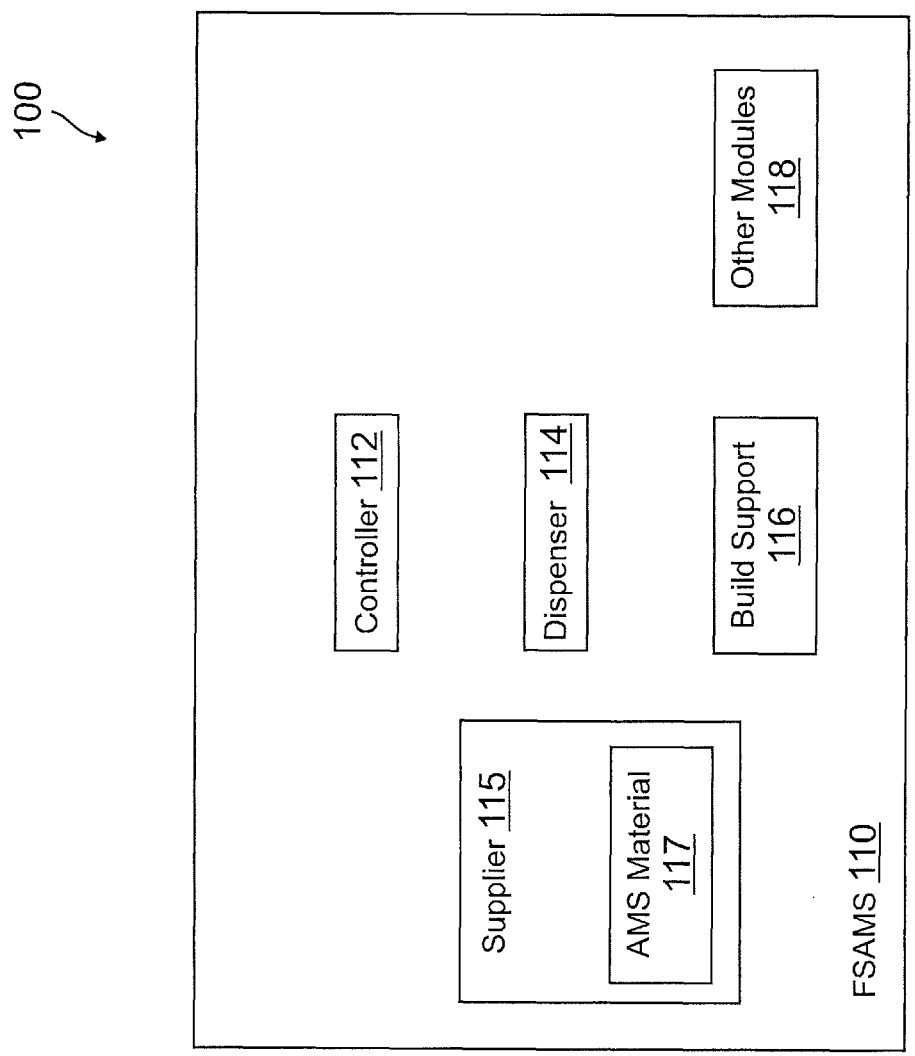
FIG. 1 illustrates a block diagram of a forming structure additive manufacturing system in accordance with an embodiment of the disclosure.

FIG. 1 illustrates a block diagram 100 of a forming structure additive manufacturing system (FSAM system) 110 in accordance with an embodiment of the disclosure. As shown in FIG. 1, FSAM system 110 includes a controller 112, a dispenser 114 configured to receive AM system material 117 from a supplier 115, and a build support 116. In various embodiments, controller 112 may be configured to control the various elements of FSAM system 110 to form a forming structure (e.g., such as forming structure 321 of FIG. 3C) with a variable and/or complex contoured surface.

For example, in embodiments where FSAM system 110 is implemented as a material extrusion AM system, controller 112 may be configured to receive a design for a forming structure (e.g., in the form of an electronic data file provided by an external logic device, such as a computer and/or a memory device) and to dispense AM system material 117 to form a forming structure from AM system material 117 using dispenser 114. In such embodiments, AM system material 117 may be acrylonitrile butadiene styrene (ABS), polycarbonate (PC), polylactic acid (PLA), high density polyethylene (HDPE), PC/ABS, polyphenylsulfone (PPSU), high impact polystyrene (HIPS), and/or other polymer filament provided by supplier 115.

More generally, FSAM system 110 may be implemented as a material extrusion AM system, a powder bed fusion AM system (e.g., which may be configured to form solid forming structures from granules fused to one another using a laser, electron-beam, and/or other types of melting, sintering, and/or fusing device), and/or a vat photopolymerization AM system (e.g., which may be configured to form solid forming structures from liquids using photopolymerization and/or other types of liquid curing processes) and/or other types of additive manufacturing systems that can be configured to form forming structures from AM system material 117.

Controller 112 may be implemented with any appropriate logic device (e.g., processing device, microcontroller, processor, application specific integrated circuit (ASIC), field programmable gate array (FPGA), memory storage device, memory reader, or other device or combinations of devices) or distributed combination of logic devices that may be adapted to execute, store, receive, and/or provide appropriate instructions, such as software instructions implementing a method and/or control loop for creating a forming structure, for example, using one or more elements of FSAM system 110. In addition, controller 112 may be implemented with one or more machine readable mediums configured to store non-transitory instructions and/or data files, such as design data files, for loading into and/or execution by controller 112. Such machine readable mediums may be internal, external, and/or otherwise configured to interface with controller 112. Controller 112 may be configured to receive non-transitory instructions and/or data files from sources remotely located from controller 112 and/or FSAM system 110. In these and other embodiments, the logic devices may be implemented with other components where appropriate, such as volatile memory, non-volatile memory, and/or one or more interfaces (e.g., inter-integrated circuit (I2C) interfaces, mobile industry processor interfaces (MIPI), joint test action group (JTAG) interfaces (e.g., IEEE 1149.1 standard test access port and boundary-scan architecture), various types of universal serial bus (USB) interfaces, Bluetooth™ interfaces, WiFi interfaces, and/or other wired and/or wireless interfaces).

Dispenser 114 may be implemented as an actuated or substantially stationary filament extrusion nozzle, liquid dispenser nozzle, print head, and/or granule placement device, and/or any other type of dispenser configured to receive AM system material 117 from supplier 115 and dispense AM system material 117 in a pattern, layer, or bulk liquid configured to form at least a portion of a forming structure supported by build support 116. For example, in embodiments where FSAM system 110 is at least partially implemented as a material extrusion AM system, dispenser 114 may include an actuated (e.g., using one or more stepper motors, for example) filament extrusion nozzle configured to receive AM system material filament from a reel or spool of supplier 115 and heat, soften, and/or melt the AM system material filament (e.g., using a heater integrated with dispenser 114) as it dispenses the AM system material filament in one or more patterned layers to form a forming structure on build support 116.

In embodiments where FSAM system 110 is at least partially implemented as a powder bed fusion AM system, dispenser 114 may include an actuated granule dispenser nozzle configured to receive AM system material granules from a reservoir of supplier 115 and dispense the AM system material granules in one or more patterned layers to form a forming structure, for example. In some embodiments, dispenser 114 may be configured to dispense AM system material onto build support 116, and one or more lasers and/or other heating or curing devices (e.g., other modules 118) may be used to melt and/or sinter the bulk AM system material on build support 116 into substantially connected patterned layers to form a forming structure.

In embodiments where FSAM system 110 is at least partially implemented as a vat photopolymerization AM system, dispenser 114 may include an actuated liquid dispenser nozzle configured to receive AM system material liquid from a reservoir of supplier 115 and dispense the AM system material liquid in one or more patterned layers to form a forming structure, for example, or dispense the AM system material liquid into a pre-formed (e.g., using a different dispenser and/or AM system, and/or other types of fabrication systems) mold. In some embodiments, the liquid dispenser nozzle may be implemented with a heater to help adjust a viscosity/flow rate of AM system material 117. In other embodiments, dispenser 114 may be configured to dispense bulk AM system material liquid into a build reservoir of build support 116, for example, and one or more lasers and/or other curing devices (e.g., other modules 118) may be used to cure patterned layers of the bulk AM system material liquid on build support 116 to forma forming structure.

In various embodiments, AM system material filament, AM system material liquid, AM system material granules, and/or other types of AM system material 117 may be cured after being dispensed by dispenser 114 by allowing the AM system material to cool, by applying a catalyst such as heat, a chemical, a type of electromagnetic radiation (e.g., light), and/or other type of catalyst, and/or by employing other types of curing processes. In some embodiments, openings may be included in a forming structure to facilitate applying a vacuum through the forming structure to conform a polymer substrate (e.g., such as polymer substrate 311 of FIG. 3) to a contoured surface (e.g., such as contoured surface 323 of FIG. 3C) during a thermoforming process and/or other application of environmental stress, as described herein.

Build support 116 may be implemented as a mechanically actuated platform, such as for a material extrusion AM system, for example, or may be implemented as a mechanically actuated reservoir and/or platform, where the reservoir may be configured to contain bulk AM system material liquid and/or bulk AM system material granules, and where the platform and/or reservoir may be configured to separate to lift a forming structure out from the reservoir as the forming structure is formed coupled to the platform. In some embodiments, build support 116 may be actuated so as to move relative to dispenser 114 to facilitate formation of a forming structure. In one embodiment, dispenser 114 may be substantially stationary throughout a manufacturing process, for example, and build support 116 may be configured to move and/or rotate relative to dispenser 114 to help form a forming structure. Build support 116 may also be implemented with one or more features configured to facilitate a type of additive manufacturing process, such as a platform temperature controller (e.g., a heater or cooler) or a device or vacuum chuck (e.g., configured to help keep a partially or completely formed forming structure or device stationary relative to build support 116 during formation).

Other modules 118 may include one or more devices configured to facilitate a type of additive manufacturing process performed by FSAM system 110. For example, other modules 118 may include a curing, melting, sintering, or fusing laser and/or electron beam device, a pattern projector, a temperature sensor (e.g., configured to monitor a temperature of dispenser 114, build support 116, an ambient temperature of FSAM system 110, and/or other process temperatures associated with operation of FSAM system 110), a device or vacuum chuck (e.g., on which to mount or form a forming structure), a transport mechanism (e.g., configured to mechanically transport a forming structure, build support 116, and/or a device or vacuum chuck to and from FSAM system 110), an alignment sensor (e.g., configured to sense a position of dispenser 114, build support 116, and/or portions of a forming structure or device supported by build support 116), one or more actuators configured to position elements of FSAM system 110 (e.g., including elements of other modules 118), one or more heaters (e.g., to adjust a temperature of dispenser 114, build support 116, an ambient temperature of FSAM system 110, and/or other elements of FSAM system 110), and/or other devices.

In some embodiments, various devices of other modules 118 may be integrated with other elements of FSAM system 110 to facilitate formation of a forming structure and/or device. For example, a heater and/or temperature sensor of other modules 118 may be integrated with dispenser 114 and/or build support 116 and/or coupled to controller 112 to help control or maintain a particular temperature at dispenser 114 and/or build support 116. In other embodiments, a heater, and/or other adjustment devices, may be integrated with dispenser 114 and/or build support 116 to help adjust a formation property of a forming structure manufactured by FSAM system 110. Such forming adjustment devices may be configured to make adjustments in situ or ex situ relative to the additive manufacturing process performed by FSAM system 110, for example, and adjustments may take place before, while, and/or after a forming structure is manufactured.

In some embodiments, a localized area of a forming structure may require additional structural material. For example, a forming structure including a fastener configured to attach to an external component may require additional structural material in the area of the fastener. Alternatively, a forming structure may require less structural material due to pronounced shape and/or contour in a localized area. In this regard, rigidity, weight, and/or other structural properties of localized areas of the forming structure may be modified and/or differentiated relative to each other by adjusting an amount and/or pattern of material used in the different localized areas of the forming structure.

In some embodiments, FSAM system 110 may be programmed to form a cavity and/or cavities within a forming structure to allow for embedding circuitry within the forming structure. Cavities may be formed within the interstitial layers of the forming structure to accept one or more circuit elements, for example, and/or circuits formed on printed circuit boards (e.g., dielectric substrates). In some embodiments, access holes in the forming structure may be formed by one or more elements of FSAM system 110 to allow for electrical connection from the embedded circuitry to external circuitry, such as that formed on a contoured surface of the forming structure and/or on a polymer substrate bonded to the contoured surface, as described herein.

Figure 2:
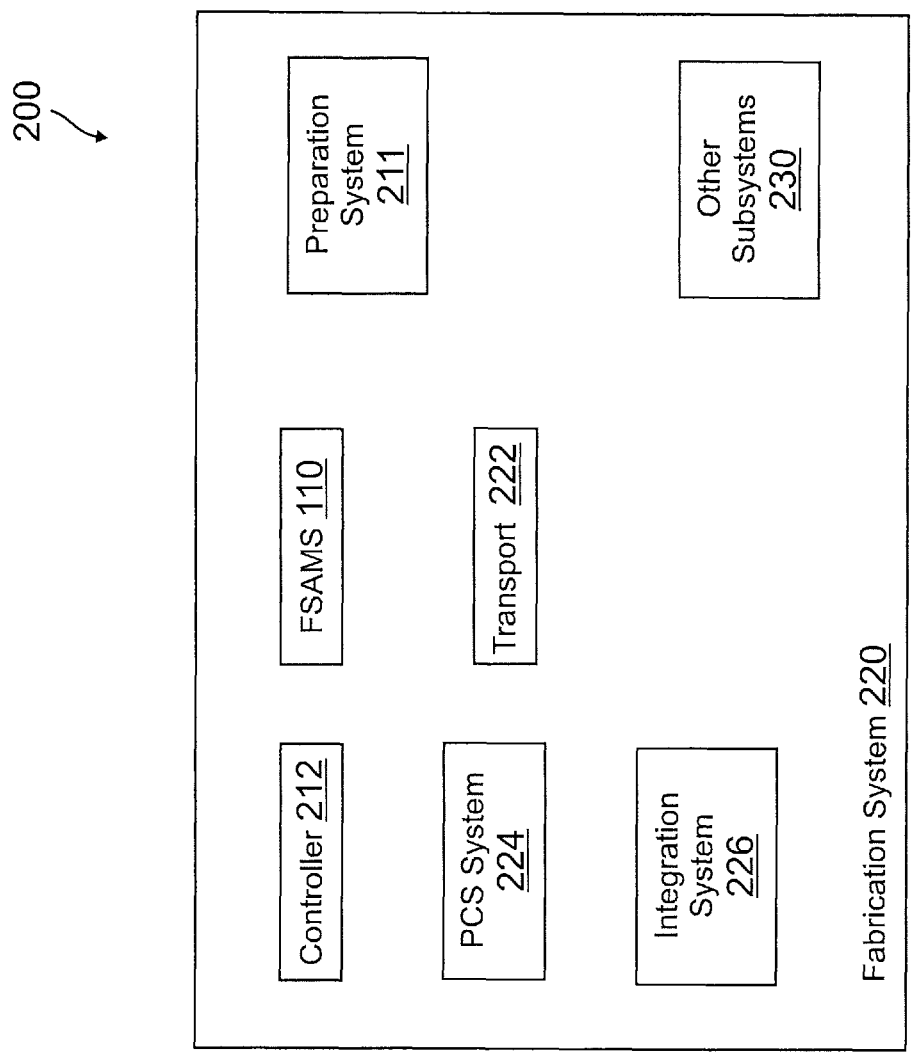
FIG. 2 illustrates a block diagram of a fabrication system including a forming structure additive manufacturing system, a printed circuit sheet manufacturing system, and/or an integration manufacturing system in accordance with an embodiment of the disclosure.

FIG. 2 illustrates a block diagram 200 of a fabrication system 220 including FSAM system 110, a printed circuit sheet (PCS) manufacturing system 224, and/or an integration manufacturing system 226 in accordance with an embodiment of the disclosure. For example, fabrication system 220 may be configured to use multiple different types of manufacturing or fabrication processes to form a contoured forming structure and a circuit on a polymer substrate and combine them to form an integrated composite structure, as described herein. Such integrated composite structures may include one or more polymer substrates conformed and/or bonded to corresponding contoured surfaces of forming structures. In some embodiments, such integrated composite structures may include additional circuitry formed directly on contoured surfaces of the forming structures and/or embedded within the forming structures (e.g., embedded circuit elements and/or an embedded circuit on a dielectric substrate).

As shown in FIG. 2, fabrication system 220 includes PCS system 224, integration system 226, and/or one or more other subsystems 230, each able to help process an integrated composite structure formed, at least in part, by FSAM system 110. In various embodiments, integrated composite structures or other structures or devices in various stages of manufacture may be conveyed between elements of fabrication system 220 by transport 222, which may be implemented as a device or vacuum chuck conveyance system, for example, and/or other transport configured to retrieve forming structures, circuitry, devices, and/or other structures from any element of fabrication system 220 and deliver them to another element of fabrication system 220. In some embodiments, transport 222 may be implemented, at least in part, by a user conveying a device or structure between elements of fabrication system 220. Operation of transport 222 and/or other elements of fabrication system 220 may be controlled and/or otherwise facilitated by controller 212, which may be implemented as one or more monolithic or distributed logic devices similar to controller 112 of FIG. 1, for example, that may be configured to communicate with any element of fabrication system 220 to operate fabrication system 220.

In the embodiment shown in FIG. 2, fabrication system 220 includes preparation system 211, which may be configured to prepare and deliver printed circuit sheet (PCS) material for use with PCS system 224. For example, preparation system 211 may be configured to deliver conductive inks (e.g., metal or carbon based conductive inks used to form conductive traces and/or circuit elements on a polymer substrate and/or a contoured surface) to PCS system 224. Preparation system 211 may also be configured to provide a flexible polymer substrate material (e.g., polyetherketoneketone (PEKK), polyether ether ketone (PEEK), polyethersulfone (PES), polyphenylsulfone (PPSU), polycarbonate (PC) and/or other polymer substrate material) to PCS system 224. In addition, preparation system 211 may be configured to deliver bonding adhesives (e.g., conductive and/or non-conductive adhesives, thermal and/or pressure sensitive adhesives, and/or other adhesives), a dielectric substrate material, a polymer substrate material, and/or discrete circuit elements (e.g., strain gauges, antenna elements, various other sensors and/or sensor elements, various actuators and/or transducers, analog elements, digital elements, and/or other discrete circuit elements) to subsystems of fabrication system 220.

In additional and/or alternative embodiments, preparation system 211 may be configured to prepare and deliver AM system, material to FSAM system 110 (e.g., AM system material 117 to supplier 115 of FSAM system 110). For example, preparation system 211 may be configured to receive bulk plastic material and convert it into filaments suitable for a material extrusion AM system. In other embodiments, preparation system 211 may be configured to receive bulk liquid polymer resin for use in a vat photopolymerization AM system, for example, and provide a portion of the liquid polymer resin to supplier 115 of FSAM system 110, for example, or, in some embodiments, to mix the portion of the liquid polymer resin with a filler or dopant before providing it to FSAM system 110. More generally, preparation system 211 may be configured to receive AM system material, in bulk, constituent, and/or other physical forms, and to provide AM system material to FSAM system 110 in forms suitable for forming particular types of forming structure using one or more type of AM system techniques employed by FSAM system 110.

In general, PCS system 224 may be configured to receive polymer substrate material and/or conductive inks (e.g., from preparation system 211) and form circuits (e.g., conductive traces and/or circuit elements) on one or more surfaces of the polymer substrate material. In some embodiments, PCS system 224 may be also be configured to shape (e.g., by cutting and/or otherwise shaping) the polymer substrate material into a polymer substrate having a particular outline. In further embodiments, PCS system 224 may be configured to form a multiple layer polymer substrate from multiple layers of polymer substrate material, each of which may include circuits formed thereon by PCS system 224. In various embodiments, PCS system 224 may be implemented as an extrusion, inkjet, and/or aerosol jet deposition system configured to receive and dispense conductive inks to form or print conductive traces and/or circuit elements on one or more surfaces of the polymer substrate material. In this regard, polymer substrate materials and conductive inks may be selected to substantially maintain functional capability when exposed to environmental stress and conformed to a contoured surface of a forming structure, as described herein.

In embodiments where PCS system 224 is at least partially implemented as an extrusion deposition system, a controlled positive pressure may be applied to a dispensing nozzle to dispense a conductive ink in fluid form on a surface of a polymer substrate. In embodiments where PCS system 224 is at least partially implemented as an inkjet deposition system, a piezoelectric diaphragm may be used to apply a positive pressure to a small orifice dispensing nozzle to dispense droplets of conductive ink in fluid form on a surface of a polymer substrate. In embodiments where PCS system 224 is at least partially implemented as an aerosol jet deposition system, conductive ink may be aerosolized and dispensed through a high velocity nozzle to impact a surface of a polymer substrate. In some embodiments, PCS system 224 may be implemented according to a direct write and/or printed electronics systems (e.g., extrusion, inkjet and/or aerosol jet deposition systems, as described herein) and used to dispense conductive inks to form conductive traces and/or circuit elements onto a contoured surface of a forming structure in order to form a circuit directly on the forming structure.

PCS system 224 may also be configured to screen print conductive traces and/or circuit elements on a polymer substrate to form a circuit on the polymer substrate. In this regard, PCS system 224 may be configured to receive a conductive paste material from preparation system 211 and to dispense the conductive paste onto a screen print mask patterned according to a desired arrangement of conductive traces and/or circuit elements and oriented accordingly on a surface of the polymer substrate. Excess conductive paste material may be removed (e.g., using the screen print mask), leaving the remaining paste material to form the conductive traces and/or circuit elements on the polymer substrate surface. PCS system 224 may also be configured to screen print conductive traces and/or circuit elements directly onto a contoured surface of a forming structure in a similar manner.

In some embodiments, PCS system 224 may be configured to form conductive vias (e.g., using deposition, screen printing, and/or other circuit forming techniques, for example) extending through one or more layers of a single or multiple layer polymer substrate. In this regard, other subsystems 230 may facilitate PCS system 224 by forming via holes (e.g., using a drill, a laser, and/or other hole formation techniques) through the layer(s) of the polymer substrate. In related embodiments, PCS system 224 may be configured to fill the via holes with a conductive ink using extrusion, deposition, and/or other techniques to electrically couple conductive traces across different surfaces and/or layers.

In various embodiments, PCS system 224 may be configured to dispense (e.g., deposit, screen print, and/or otherwise dispense) a bonding adhesive on a surface of a polymer substrate and/or a contoured surface of a forming structure to facilitate bonding discrete circuit elements on such surfaces. In this regard, PCS system 224 may receive a bonding adhesive material from preparation system 211 and dispense the bonding adhesive to form a layer and/or pattern of bonding adhesive on a surface (e.g., of a polymer substrate or a contoured surface of a forming structure) at a location where a discrete circuit element may be placed. In some embodiments, PCS system 224 may be configured to dispense bonding adhesive into one or more cavities formed within a forming structure (e.g., prior to completion of the manufacture of the forming structure) in preparation to bond one or more discrete circuit elements and/or circuit substrates within the cavities.

Integration system 226 may be configured to receive a forming structure and a polymer substrate and to apply environmental stress to the polymer substrate and/or the forming structure to conform and/or adhere the polymer substrate to a contoured surface of the forming structure. For example, integration system 226 may be implemented as any mechanical, thermal, vacuum, and/or pressure forming system configured to combine a polymer substrate with a forming structure to produce or form an integrated composite structure, as described herein.

In some embodiments, integration system 226 may be configured to receive a forming structure from preparation system 211 and to secure the forming structure to a form support table. The form support table may horizontally position and raise and lower the forming structure to contact a polymer substrate (e.g., provided by PCS system 224) during the integrating process. A vacuum pump may be included in the form support table to generate a vacuum through openings within the form support table and openings within the forming structure, and thereby supply at least a portion of the environmental stress to conform the polymer substrate to the contoured surface of the forming structure.

Integration system 226 may also be configured to receive a polymer substrate from preparation system 211 and secure the polymer substrate to a stationary or position-adjustable framed support structure. A heater element (e.g., such as an infrared heater element, for example) of integration system 226 may be mounted to a horizontal sliding frame and positioned over or otherwise in view of the polymer substrate. The heater element may be configured to thermal cycle the polymer substrate to soften the polymer substrate in preparation for and/or to allow combining the polymer substrate with a forming structure such that the shape of the polymer substrate can conform to a contoured surface of the forming structure.

In some embodiments, the heater element may be configured to heat the polymer substrate and cure conductive traces and/or circuit elements (e.g., formed from inks, pastes, and/or other circuit forming material provided by PCS system 224) on the polymer substrate. In other embodiments, the heater element may be configured to cure similar circuitry formed on the contoured surface itself and/or to activate bonding adhesive applied to the contoured surface and/or the polymer substrate. In various embodiments, the heater element may be configured to thermally cycle an integrated composite structure in order to fully cure circuitry forming material and/or bonding adhesives after the polymer substrate is conformed to the contoured surface.

In various embodiments, other subsystems 230 may include one or more devices configured to facilitate a fabrication process performed by fabrication system 220 and/or processes performed within and/or by other elements of fabrication system 220. For example, other subsystems 230 may include an electric discharge machining (EDM) system, such as a wire EDM, configured to cut a completed and/or partially completed forming structure from bulk material (e.g., Styrofoam and/or other bulk material that can be shaped by an EDM system) and provide the resulting partial and/or completed forming structure to FSAM system 110, PCS system 224, integration system 226, and/or other elements of fabrication system 220 using transport 222 (e.g., to complete manufacturing of the forming structure, add circuitry and/or adhesive to the forming structure, combine the forming structure with a polymer substrate, and/or otherwise facilitate forming an integrated composite structure). In some embodiments, such EDM system may receive a partially completed forming structure from FSAM system 110 and complete the forming structure by shaping the partially completed forming structure. Preparation system 211 may be configured to provide a spool of suitable wire and/or a dielectric fluid, both used in wire EDM processes, to facilitate shaping of a forming structure.

Other subsystems 230 may also include a subsystem configured to bond two or more layers of a polymer substrate (e.g., with or without circuitry provided by PCS system 224) together to form a multiple layer polymer substrate. In some embodiments, external pressure and/or a vacuum may be applied to two or more layers to form a multiple layer polymer substrate. In other embodiments, two or more layers may be thermally cycled to form a multiple layer polymer substrate. In some embodiments, such subsystem of other subsystems 230 may be integrated with PCS system 224 and configured to dispense bonding adhesive on a surface of a polymer substrate and/or a contoured surface to facilitate bonding layers of polymer substrate to one another and/or to a forming structure.

More generally, any subsystem or element of other subsystems 230 may be integrated with other elements of fabrication system 220 to help facilitate forming a forming structure. For example, other subsystems 230 may include a pick and place machine that is integrated with FSAM system 110 and/or PCS system 224 to help place one or more discrete circuit elements and/or circuits on dielectric substrates (e.g., pre-manufactured PCBs) into or on polymer substrates and/or forming structures. In other embodiments, one or more elements of other subsystems 230 may be integrated with PCS system 224 to help facilitate bonding discrete circuit elements on a contoured surface and/or a polymer substrate. For example, other subsystems 230 may be configured to remove discrete circuit elements from a protective package and place the discrete circuit elements in a proper location and orientation on a polymer substrate and/or a contoured surface in preparation for bonding.

In another embodiment, other subsystems 230 may include a subsystem configured to form via holes in a polymer substrate using a drill and/or a low temperature laser, for example, and/or to cut or otherwise shape a polymer substrate to substantially conform to an outline of a contoured surface of a forming structure. In this regard, such subsystem may include an actuated cutting or trimming tool, a laser, or any suitable subsystem configured to shape a polymer substrate.

In further embodiments, other subsystems 230 may include a subsystem or device configured to clean, polish, and/or otherwise finish a contoured surface of a forming structure in preparation for applying bonding adhesive and/or combining with a polymer substrate, as described herein. For example, in embodiments where FSAM system 110 is implemented as a material extrusion AM system, other subsystem 230 may include an acetone bath, actuated polishing device, and/or other surface finishing system configured to remove or smooth relatively small imperfections in a contoured surface of the forming structure, such as ridges formed by the multiple layers of filament fused together to form the contoured surface. Other subsystems 230 may also include a subsystem configured to help prepare a polymer substrate and/or a forming structure for bonding to each other by providing a heat and/or other forms of activation energy to activate a bonding adhesive applied to the polymer substrate and/or forming structure.

In various embodiments, other subsystems 230 may include a subsystem configured to apply a protective coating to an exposed surface of a polymer substrate and/or integrated composite structure, as described herein. For example, such subsystem (e.g., which may be integrated with PCS system 224 and/or integration system 226, for example) may include a direct write aerosol jet, for instance, that may be used to apply the protective coating. In other embodiments, PCS system 224 and/or other subsystems 230 may be configured to apply a blank polymer substrate (e.g., a polymer substrate without electrically conductive features) as an outer protective layer to an integrated composite structure.

In this regard, one or more elements of fabrication system 220 provide processes for integrating electronics with a forming structure, which can then be used as a structural component for a relatively robust yet lightweight device and/or vehicle, for example. Furthermore, embodiments of fabrication system 220 may be relatively compact and, as a result, be mobile and able to manufacture devices and/or vehicles in the field, such as in the context of a tactical deployment. Conventional methods are relatively expensive, complex, large scale, and time consuming (e.g., cannot reasonably be implemented compact, simple, and robust enough to be employed as a mobile fabrication system), and do not integrate circuitry with contoured surfaces of structural components in a way that increases an overall strength to weight ratio of resulting structural components, as is provided by embodiments of the present disclosure. In this regard, elements of fabrication system 220 provide a cost and time effective method to reliably produce integrated composite structures, as described herein.

FIGS. 3A-D illustrate processes for forming a circuit on a polymer substrate and bonding the polymer substrate to a contoured surface of a forming structure in accordance with embodiments of the disclosure. FIG. 3A shows diagram 300 of a circuit 310 formed on a substantially flat polymer substrate 311 in accordance with an embodiment of the disclosure. In some embodiments, circuit 310 may include a plurality of conductive traces 317 and/or one or more circuit elements 312. Conductive traces 317 may be configured to electrically couple one or more circuit elements 312 to each other and/or to external circuitry. Circuit elements 312 may include one or more electrical and/or electronic circuit elements, such as strain gauges, antenna elements, other sensors and/or sensor elements, various actuators and/or transducers, resistors, capacitors, inductors, and/or corresponding structures, and/or various other analog and/or digital circuit elements, for example.

FIG. 3B illustrates a cross section 301 of circuit 310 formed on polymer substrate 311 (e.g., using PCS system 224) in accordance with an embodiment of the disclosure. The plurality of conductive traces 317 and/or one or more circuit elements 312 may be formed on one or more surfaces 316 of polymer substrate 311. In some embodiments, polymer substrate 311 may include one or more layers 313 of a flexible polymer sheet material (e.g., polyetherketoneketone (PEKK), polyether ether ketone (PEEK), polyethersulfone (PES), polyphenylsulfone (PPSU), polycarbonate (PC) and/or other polymer substrate material). Conductive traces 317 and/or circuit elements 312 may be formed on one or more surfaces of interstitial layers 313 of polymer substrate 311 (e.g., surfaces subsequently bonded together to form polymer substrate 311), such as prior to laminating or otherwise adhering or bonding the layers together to form polymer substrate 311. Conductive vias 315 may be formed within or through layers 313 to electrically couple conductive traces 317 and/or circuit elements 312 on different faces of the constituent layers 313 to each other. In various embodiments, PCS system 224 and/or other systems 230 may be configured to bond layers 313 together to form polymer substrate 311 and/or circuit 310. Formation of circuit 310 may employ application of inks, pastes, discrete circuit elements, and/or other techniques, as described herein.

FIG. 3C includes cross section 302 illustrating a fabrication step of conforming polymer substrate 311 to contoured surface 323 of forming structure 321, in accordance with an embodiment of the disclosure. Forming structure 321 and/or contoured surface 323 may be manufactured, shaped, and/or otherwise formed by FSAM system 110 and/or other subsystems 230 of fabrication system 220. In some embodiments, conforming polymer substrate 311 to contoured surface 323 may include applying a thermal and/or pressure sensitive bonding adhesive 325 to polymer substrate 311 and/or contoured surface 323 (e.g., using PCS system 224) to adhere polymer substrate 311 to contoured surface 323. In other embodiments, polymer substrate 311 may be thermally cycled so as to adhere to forming structure 321 without need of adhesive 325.

Polymer substrate 311 may be thermal cycled to help polymer substrate 311 become pliable and aid in conforming the shape of polymer substrate 311 generally to the shape of contoured surface 323. For example, circuit 310 and/or polymer substrate 311 may be conformed to contoured surface 323 using integration system 226 to deform polymer substrate 311 by applying an environmental stress 333 to substantially conform and/or adhere polymer substrate 311 to contoured surface 323 of forming structure 321. Environmental stress 333 may include one or more of thermal cycling, application of pressure, application of vacuum, and/or other application of other types of environmental stress. In some embodiments, integration system 226 may be configured to apply vacuum through openings 339 (e.g., through-channels or holes) in forming structure 321 to substantially press or conform polymer substrate 311 to a shape of contoured surface 323, as shown.

FIG. 3D illustrates a cross section 303 of an integrated composite structure 320 in accordance with an embodiment of the disclosure. In the embodiment shown in FIG. 3D, circuit 310 and polymer substrate 311 are substantially conformed to and/or adhered to contoured surface 323 of forming structure 321, and the combination forms integrated composite structure 320. In some embodiments, protective coating 328 may be applied to an exposed surface 316 of polymer substrate 311 to provide a moisture and/or environmental barrier. Such protective coating may be sprayed, brushed, or dipped on, for example, and/or may take the form of an additional blank polymer layer formed over polymer substrate 311. Protective coating 328 may be any electrically non-conductive coating (e.g., an organic coating) that provides a moisture and/or environmental barrier. In some embodiments, protective coating 328 may be electrically insulating and thermally conductive to allow heat built up within integrated composite structure 320 to be conducted to the surrounding environment and/or other coupled structures.

FIG. 3E illustrates a cross section 304 of circuit elements 312 embedded within forming structure 321 in accordance with an embodiment of the disclosure. For example, FIG. 3E shows one or more embedded circuit elements 312 bonded within a cavity 329 formed in forming structure 321 and electrically coupled to circuit 310 on polymer substrate 311. One or more circuit elements 312 may be embedded within forming structure 321 by first forming one or more cavities 329 within intermediate layers of forming structure 321. Cavities 329 may be formed to accept one or more circuit elements 312. In some embodiments, circuit elements 312 may be discrete circuit elements 312, as described herein, and each discrete circuit element 312 may be placed within cavity 329 and bonded within cavity 329 (e.g., using PCS system 224 and/or other subsystems 230). In other embodiments, circuit elements 312 may be formed by PCS system 224, such as structures formed by an inking and/or extrusion deposition process, as described herein.

Each of one or more circuit elements 312 may be electrically coupled to circuit 310 using conductive vias 335. In this regard, conductive vias 335 may be implemented as access holes (e.g., formed in situ by FSAM system 110) filled with conductive ink (e.g., by PCS system 224) while or after forming structure 321 is formed. In some embodiments, conductive contact pads 327 may be formed on contoured surface 323 (e.g., using PCS system 224) to contact conductive vias 335 and circuit 310 to electrically couple one or more embedded circuit elements 312 to circuit 310 on polymer substrate 311. In other embodiments, conductive vias 335 may be electrically coupled directed to circuit 310 when polymer substrate 311 is bonded or otherwise conformed to contoured surface 323.

FIG. 3F illustrates a cross section 305 of a circuit 330 embedded within forming structure 321 in accordance with an embodiment of the disclosure. FIG. 3F shows embedded circuit 330 bonded within a cavity 331 formed in forming structure 321 and electrically coupled to circuit 310 on polymer substrate 311 through conductive vias 335 and/or conductive contact pads 327. Circuit 330 may be embedded within forming structure 321 by first forming cavity 331 within forming structure 321. In this regard, FSAM system 110 may be configured to forma substantially planar cavity 331 within forming structure 321 during the AM system process to match a size and/or shape of embedded circuit 330, which may be formed on a substantially planar dielectric substrate. In some embodiments, circuit 330 may be formed on dielectric substrate 341 using methods similar to form circuit 310 on polymer substrate 311. Circuit 330 on dielectric substrate 341 may be placed within cavity 331 and bonded within cavity 331 by PCS system 224 and/or other subsystems 230 of fabrication system 220.

Figure 4A:
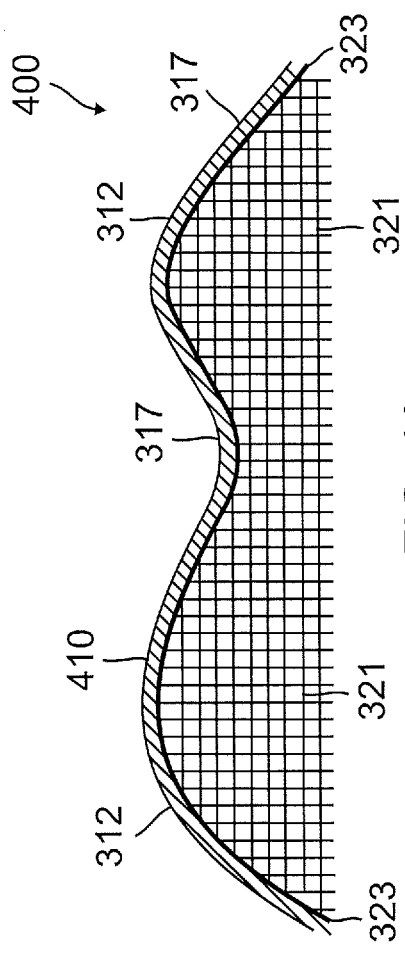
FIGS. 4A-C illustrate processes for forming a circuit on a contoured surface of a forming structure and bonding a polymer substrate to the circuit and the contoured surface of the forming structure in accordance with embodiments of the disclosure.

FIG. 4A illustrates a cross section 400 of a circuit 410 formed on a contoured surface 323 of forming structure 321 in accordance with an embodiment of the disclosure. Circuit 410 may include a plurality of conductive traces 317 and/or one or more circuit elements 312, which may include various electrical and/or electronic circuit elements, such as strain gauges, antenna elements, other sensors and/or sensor elements, various actuators and/or transducers, resistors, capacitors, inductors, and/or corresponding structures, and/or various other analog and/or digital circuit elements, for example. In various embodiments, other subsystems 230 may be configured to prepare contoured surface 323 (e.g., by sanding, polishing, and/or otherwise smoothing a non-uniform or unfinished contoured surface 323 and/or depositing a layer of dielectric material over non-uniform or unfinished contoured surface 323 to fill voids created during the FSAM system 110 process) before forming circuit 410 on contoured surface 323.

In some embodiments, PCS system 224 may be implemented to form conductive traces 317 and/or circuit elements 312 on contoured surface 323 using direct write and/or printed electronics methods, as described herein. In other embodiments, PCS system 224 may be configured to screen print conductive traces 317 and/or circuit elements 312 on contoured surface 323. Such circuit elements may include discrete components that may be bonded to contoured surface 323 with bonding adhesive (e.g., deposited by PCS system 224) using a screen print and/or deposition method (e.g., employing solder paste and/or other similar conductive pastes and/or inks). Conductive traces 317 may be deposited on contoured surface 323 to electrically couple one or more circuit elements 312 to each other and/or to external circuitry.

Figure 4C:
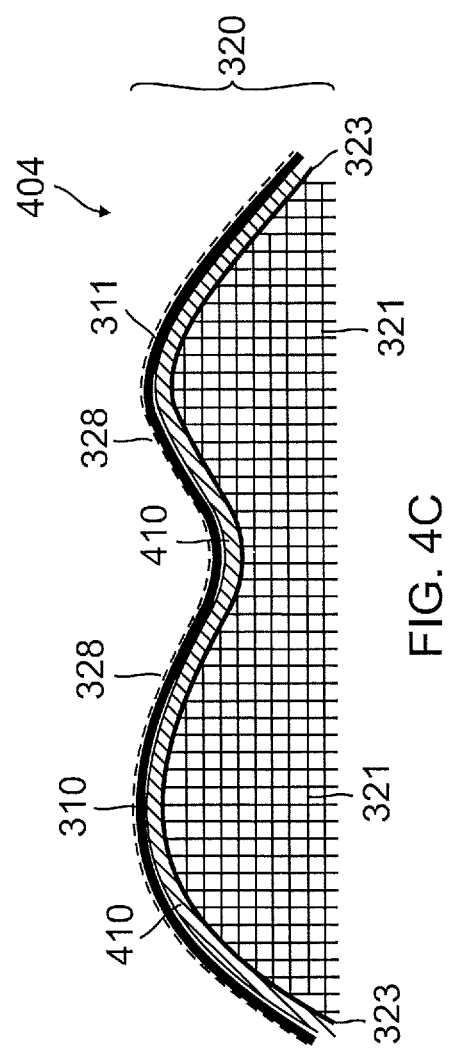
Figure 4B:
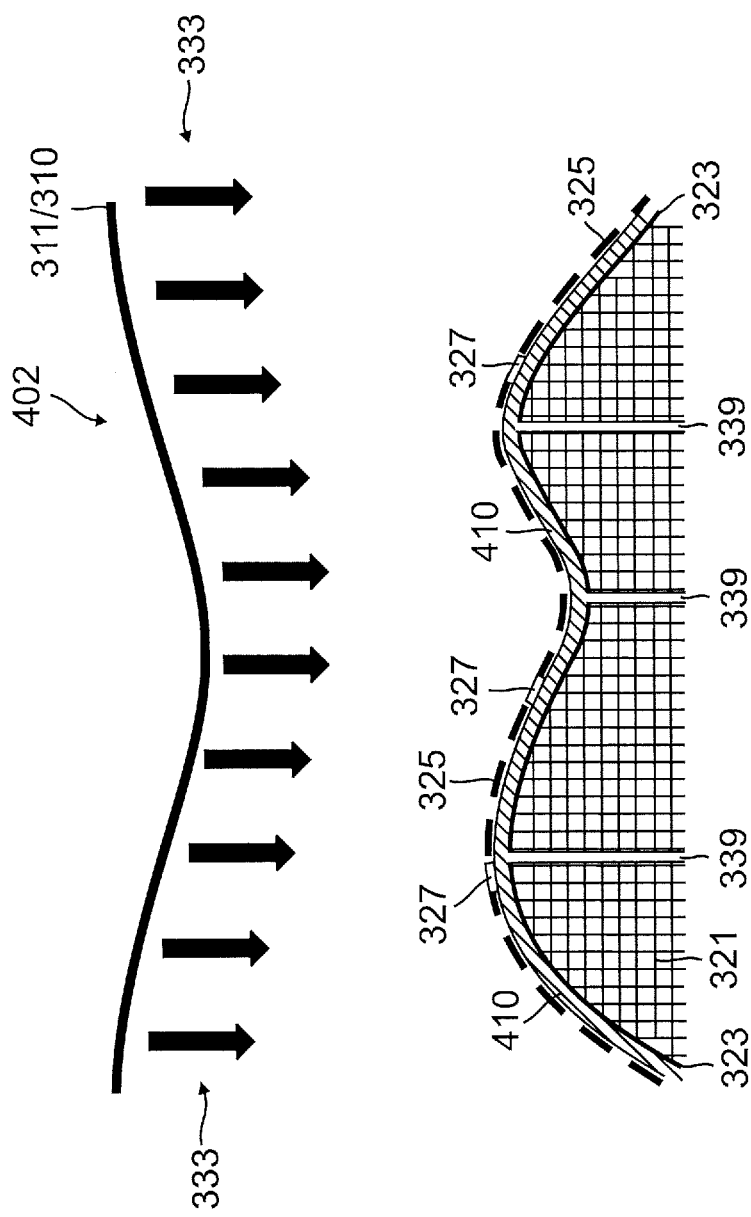

FIG. 4B includes cross section 402 illustrating a fabrication step of conforming polymer substrate 311 to circuit 410 formed on contoured surface 323 of forming structure 321, in accordance with an embodiment of the disclosure. Conforming polymer substrate 311 to circuit 410 on contoured surface 323 may use similar processes used for conforming polymer substrate 311 directly to contoured surface 323, and similar methods and materials may be used for conforming and/or adhering polymer substrate 311 to circuit 410 and/or contoured surface 323. Contact pads 327 may be formed on circuit 410 at locations where circuit 410 electrically couples to circuit 310.

FIG. 4C illustrates a cross section 404 of an integrated composite structure 320 in accordance with an embodiment of the disclosure. As shown in the embodiment presented by FIG. 4C, integrated composite structure 320 includes circuit 410 formed on contoured surface 323 and electrically coupled to circuit 310 on polymer substrate 311, which is conformed to contoured surface 323. Protective coating 328 may optionally be applied to the exposed surface 316 of polymer substrate 311, as described herein.

FIG. 5A illustrates a top view 500 of a circuit 510 formed on a polymer substrate 511 in accordance with an embodiment of the disclosure. Circuit 510 may be formed on polymer substrate 511 in a manner similar to that described with respect to circuit 310 formed on polymer substrate 311. FIG. 5B illustrates a perspective view 501 of polymer substrate 511 conformed to a contoured surface 523 of a forming structure 521 in accordance with an embodiment of the disclosure. Circuit 510 on polymer substrate 511 may be substantially conformed to contoured surface 523 of forming structure 521 by deforming, cutting, and/or otherwise shaping polymer substrate 511 in a manner similar to processes and/or functionality described with respect to FIGS. 1-4C.

FIGS. 6A-D illustrate flow diagrams describing various processes for forming an integrated composite structure 320 in accordance with embodiments of the disclosure. The operations of FIGS. 6A-D may be implemented with any combination of software instructions executed by one or more devices associated with corresponding elements of FIGS. 1-2 and/or other electronic devices configured to support operations of FIGS. 6A-D. Any step or block of processes illustrated in FIGS. 6A-D may be performed in an order or arrangement different from the embodiments illustrated in FIGS. 6A-D. For example, in other embodiments, one or more blocks from one process may be included in another process and/or otherwise omitted. Although the processes illustrated in FIGS. 6A-D are described with reference to elements of FIGS. 1-5B, the processes may be performed by other elements and/or systems including a different selection of modules and/or systems.

Figure 6A:
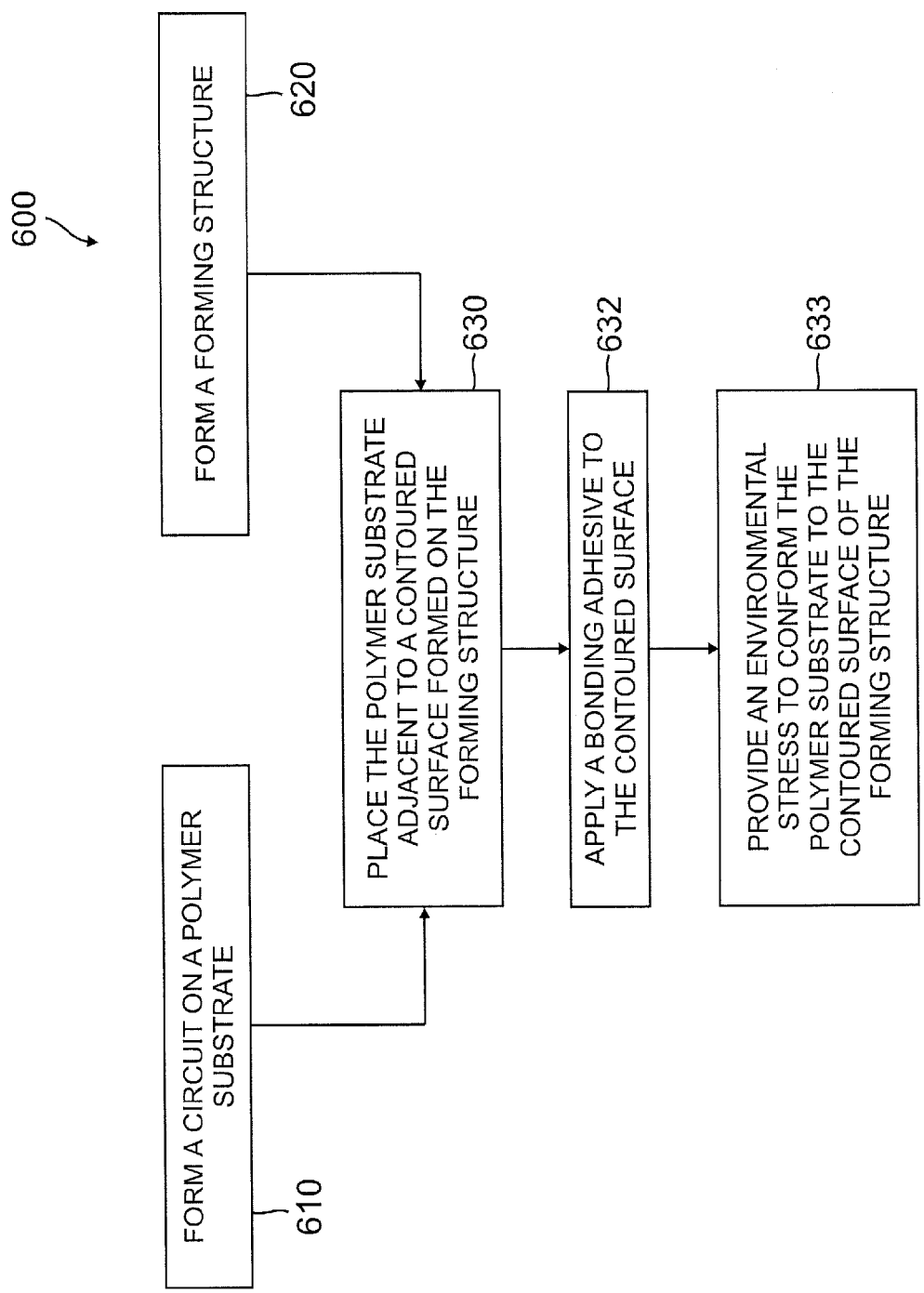

FIG. 6A illustrates a flow diagram 600 describing a method for forming an integrated composite structure, such as integrated composite structure 320 of FIGS. 3A-4C. Method 600 may begin in block 610 by forming a circuit on a polymer substrate. For example, PCS system 224 of fabrication system 220 may be configured to form circuit 310 on polymer substrate 311. In various embodiments, circuit 310 may include a plurality of conductive traces 317 and/or one or more circuit elements 312. Conductive traces 317 may be configured to electrically couple one or more circuit elements 312 to each other and/or to external circuitry. Circuit elements 312 may include one or more electrical and/or electronic circuit elements, such as strain gauges, antenna elements, other sensors and/or sensor elements, various actuators and/or transducers, resistors, capacitors, inductors, and/or corresponding structures, and/or various other analog and/or digital circuit elements, for example.

In some embodiments, PCS system 224 of fabrication system 220 may be configured to receive polymer substrate material and conductive inks from preparation system 211 and dispense the conductive inks to print conductive traces 317 and/or circuit elements 312 on one or more surfaces of polymer substrate 311 to form circuit 310 on polymer substrate 311. The polymer substrate material and the conductive inks may be selected to maintain functional capability when deformed by environmental stress and conformed to contoured surface 323.

In embodiments where circuit elements 312 include discrete circuit elements, such elements may be bonded directly to polymer substrate 311. For example, PCS system 224 may be configured to apply bonding adhesive 319 (e.g., a conductive or non-conductive adhesive, and/or a thermal and/or pressure sensitive adhesive) at respective corresponding locations on polymer substrate 311.

Method 600 may continue with block 620 by forming a forming structure 321. For example, FSAM system 110, other subsystems 230, and/or other elements of fabrication system 220 may be configured to form forming structure 321. FSAM system 110 may include a material extrusion AM system, a powder bed fusion AM system, and/or a vat photopolymerization AM system. Other subsystems 230 may include an EDM system configured to shape forming structure 321 from bulk material and/or from a partially completed forming structure (e.g., supplied by FSAM system 110), for example.

In some embodiments, FSAM system 110 may be configured to form forming structure 321 with a contoured surface 323. Adjustments may be made during the forming process to adjust an amount and/or pattern of material used in localized areas of forming structure 321 to adjust rigidity and/or a weight of the localized areas of forming structure 321. For example, additional structural material may be added within forming structure 321 where additional weight bearing or other stress may be anticipated in a localized area. Alternatively, material may be removed in localized areas of forming structure 321 where, for example, there may be excess shape and/or contour.

Method 600 may continue with block 630 by placing polymer substrate 311 and circuit 310 formed thereon adjacent to contoured surface 323 of forming structure 321. For example, transport 222 of fabrication system 220 may be configured to convey forming structure 321 from FSAM system 100 to integration system 226 and polymer substrate 311 from PCS system 224 to integration system 226. In some embodiments, polymer substrate 311 may be secured in a framed support structure and aligned with and/or held stationary over contoured surface 323 of forming structure 321 within integration system 226.

Method 600 may continue with optional block 632 by applying a bonding adhesive 325 to the contoured surface 323. For example, PCS system 224, integration system 226, and/or other subsystems 230 of fabrication system 220 may be configured to apply bonding adhesive 325 to polymer substrate 311 and/or contoured surface 323. In various embodiments, other subsystems 230 may be configured to prepare contoured surface 323 for application of the bonding adhesive and/or for binding to polymer substrate 311 by cleaning and/or finishing contoured surface 323, as described herein.

In some embodiments, PCS system 224, integration system 226, and/or other subsystems 230 may be configured to deposit a layer and/or pattern of bonding adhesive 325 on polymer substrate 311 and/or contoured surface 323 where polymer substrate 311 is to be bonded to contoured surface 323. In other embodiments, such systems may be configured to employ a screen print technique to deposit a layer and/or pattern of bonding adhesive 325 on polymer substrate 311 and/or contoured surface 323. In various embodiments, bonding adhesive 325 may be activated (e.g., by application of heat, air, pre-curing time, additional chemicals or agents, and/or other activation circumstances) after application of adhesive 325. In alternative embodiments, application and/or activation of bonding adhesive 325 may be omitted in circumstances where polymer substrate 311 is configured to adhere to contoured surface 323 after application of environmental stress, as described with respect to block 633.

Method 600 may continue with block 633 by providing an environmental stress 333 to conform polymer substrate 311 to contoured surface 323 of forming structure 321. For example, integration system 226 may be configured to align polymer substrate 311 with an appropriate portion of contoured surface 323 and/or apply environmental stress 333 to deform polymer substrate 311 to substantially conform (e.g., to match a shape of contoured surface 323) and/or adhere polymer substrate 311 to contoured surface 323 of forming structure 321 to form integrated composite structure 320.

Environmental stress 333 may include one or more of thermal cycling, application of pressure, application of vacuum, and/or application of other environmental stresses. In one embodiment, environmental stress 333 may be applied by a thermoforming system with vacuum. For example, integration system 226 may apply a vacuum through openings 339 formed in forming structure 321 to conform polymer substrate 311 to forming structure 321 while applying heat and/or otherwise thermally cycling polymer substrate 311.

In some embodiments, polymer substrate 311 may be heated and/or thermally cycled by integration system 226 prior to and/or while conforming polymer substrate 311 to contour surface 323 to help polymer substrate 311 become pliable enough to conform to contoured surface 323 when environmental stress 333 is applied. For example, a heater element (e.g., other subsystems 230) integrated with integration system 226 may be configured to thermal cycle polymer substrate 311 to make polymer substrate 311 more pliable, for example, and the same heater element may then be used to cure inks and/or pastes formed as conductive traces 317 and/or circuit elements 312 on polymer substrate 311, and/or to cure bonding adhesive 319. In some embodiments a protective coating 328 may be applied to an exposed surface 316 of polymer substrate 311 after or while such materials are curing. Thus an integrated composite structure is provided.

Figure 6B:
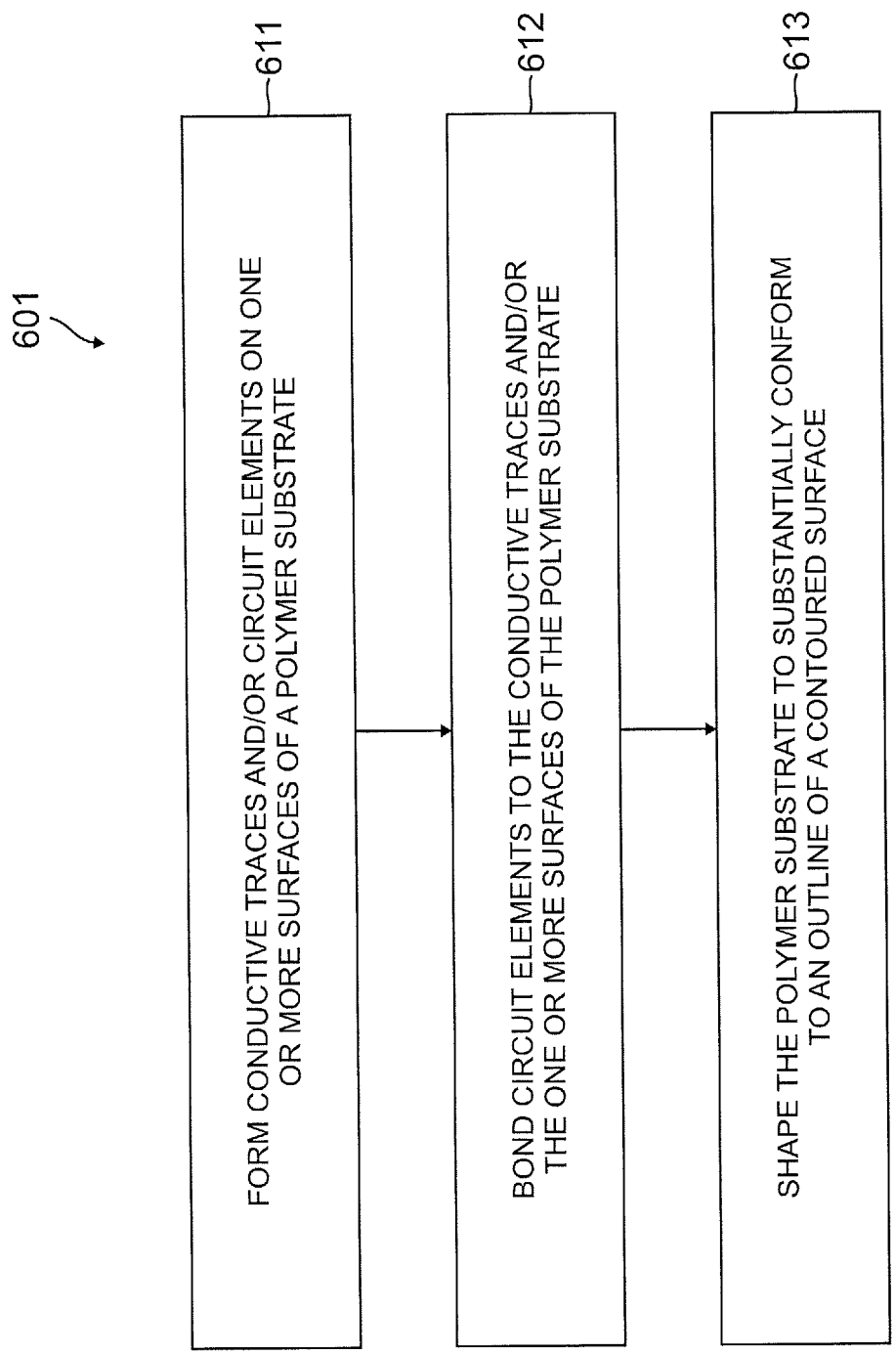

FIG. 6B illustrates a flow diagram 601 describing a method for forming circuit 310 on polymer substrate 311. Method 601 may begin with block 611 by forming conductive traces 317 and/or circuit elements 312 on one or more surfaces 316 of polymer substrate 311. For example, PCS system 224 may be configured to form conductive traces 317 and/or circuit elements 312 on polymer substrate 311, where conductive traces 317 are configured to electrically couple circuit elements 312 to each other and/or external circuitry. Circuit elements 312 and/or conductive traces 317 may be formed by extrusion, inkjet, aerosol jet deposition methods, screen printing and/or paste deposition methods, for example, and, in embodiments where polymer substrate 311 is a multiple layer polymer substrate, conductive traces 317 and/or circuit elements 312 may be formed on one or more interstitial layers 313 of polymer substrate 311 prior to the constituent polymer substrate material layers being bonded together. In some embodiments, PCS system 224 and/or other subsystems 230 may be configured to thermally cycle and/or apply pressure and/or vacuum to bond one or more layers 313 together to form a multiple layer polymer substrate 311.

In some embodiments, conductive vias 315 may be formed within one or more layers 313 of polymer substrate 311 to electrically couple conductive traces 317 and/or circuit elements 312 on different surfaces to each other. For example, PCS system 224 and/or other subsystems 230 may be configured to form conductive vias 315 extending through one or more layers 313 of polymer substrate 311, as described herein.

Method 601 may continue with optional block 612 by bonding circuit elements 312 to conductive traces 317 and/or surfaces 316 of polymer substrate 311. For example, in some embodiments, circuit elements 312 may include discrete components that may be bonded to polymer substrate surfaces 316 with a bonding adhesive 319, as described herein.

Method 601 may continue with optional block 613 by shaping polymer substrate 311 to substantially conform to an outline of a contoured surface 323. For example, PCS system 224 and/or other subsystems 230 may be configured to cut and/or otherwise shape polymer substrate 311 such that polymer substrate conforms to contoured surface 323 and/or a portion of contoured surface 323 without excess material extending outside an outline of contoured surface 323 and/or a portion of contoured surface 323. In this regard, polymer substrate 311 may be cut and/or otherwise shaped using a laser, a cutting tool and/or any suitable method to shape polymer substrate 311 to substantially conform to an outline of contoured surface 323 of forming structure 321.

Figure 6C:
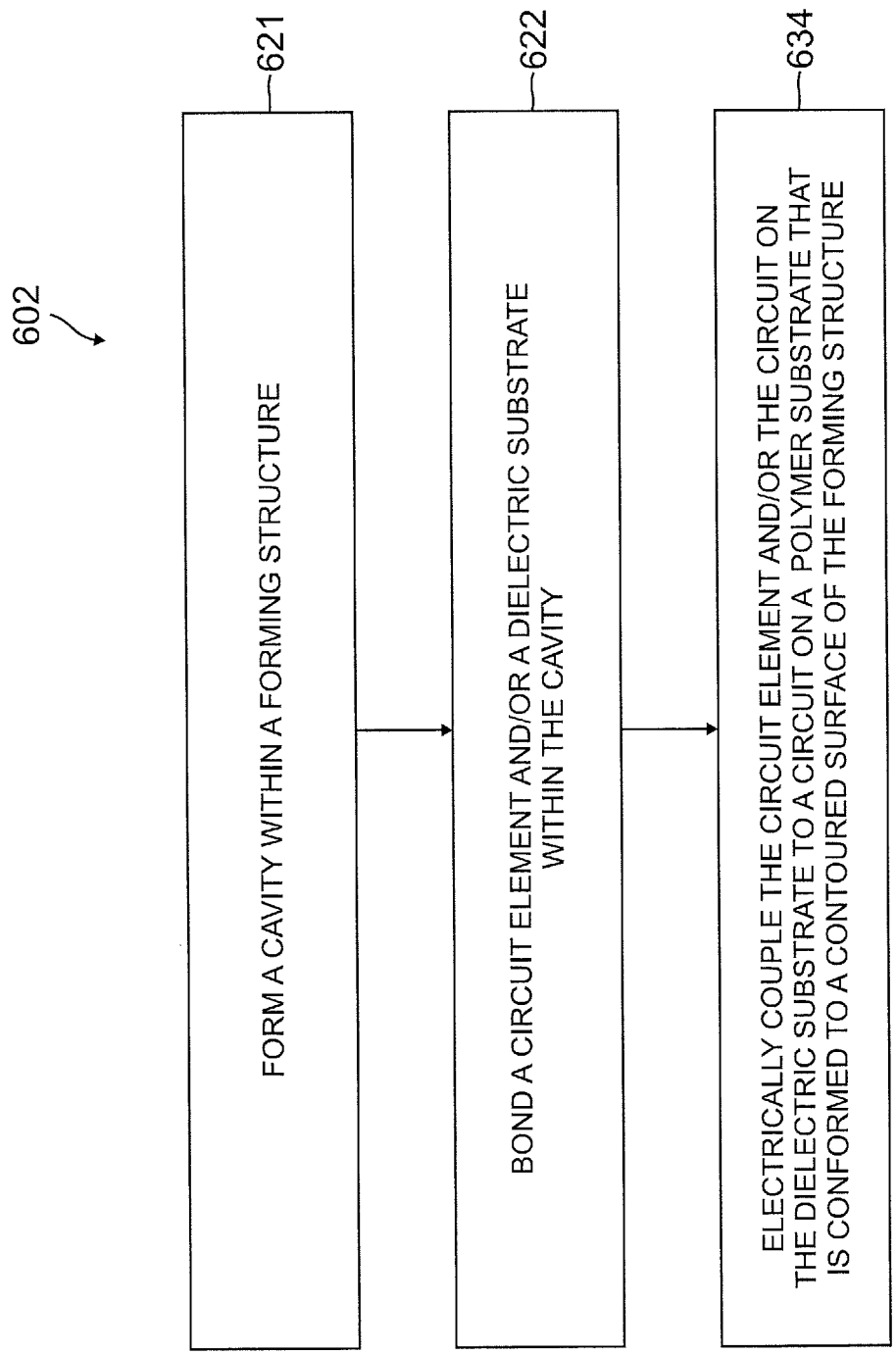

FIG. 6C illustrates a flow diagram 602 describing a method for embedding one or more circuit elements 312 and/or a circuit 330 on a dielectric substrate 341 in a forming structure 321. Method 602 may begin with block 621 by forming a cavity 329 within forming structure 321. For example, FSAM system 110 of fabrication system 220 may be configured to form one or more cavities 331/329 within forming structure 321, such as at an intermediate point in the manufacture of forming structure 321, and FSAM system 110 and/or PCS system 224 may be configured to embed (e.g., form and/or place) one or more circuit elements 312 within forming structure 321. In some embodiments, a cavity 331 formed for circuit 330 on dielectric substrate 341 may be a substantially planar cavity 331 formed within forming structure 321 to conform to a shape and/or outline of dielectric substrate 341. In various embodiments, the process of forming circuit 330 on a substantially planar dielectric substrate 341 and/or within cavity 331 may be similar to the process used to form circuit 310 on polymer substrate 311. Access holes (e.g., access holes for conductive vias 335) may be formed by FSAM system 110 and/or other subsystems 230 to allow for electrical connection from the embedded circuitry to circuits formed on contoured surface 323 of forming structure 321 and/or to circuit 310 on polymer substrate 311 bonded to contoured surface 323.

Method 602 may continue with block 622 by bonding a circuit element 312 and/or a dielectric substrate 341 within the cavity (e.g., cavity 329 and/or 331). In some embodiments, circuit elements 312 formed within cavity 329 may be printed circuit elements 312. For example, PCS system 224 may be configured to print circuit element 312 within forming structure 321. In this regard, controller 212 may interrupt FSAM system 110 at an intermediate and/or partially completed step in the manufacture of forming structure 321, allowing PCS system 224 and/or other subsystems 230 to prepare the intermediate and/or partially completed forming structure 321 (e.g., using a cleaning or smoothing process, for example), as described herein. PCS system 224 may dispense conductive ink and/or paste onto a surface of cavity 329 to form circuit element 312. Controller 212 may instruct FSAM system 100 to resume manufacture of forming structure 321 after forming circuit element 312 within cavity 329.

In other embodiments, discrete circuit elements 312 may be bonded within cavity 329 using a conductive and/or non-conductive bonding adhesive 319 dispensed by PCS system 224 and/or other subsystems 230. Controller 212 may instruct FSAM system 110 to resume manufacture of forming structure 321 after bonding discrete circuit elements 312 within cavities 329. In additional embodiments, dielectric substrate 341 may be bonded within cavity 331. In this regard, controller 212 may interrupt FSAM system 110 during formation of forming structure 321, and control other subsystems 230 and/or other elements of fabrication system 220 to prepare a partially completed forming structure 321 for bonding, as described herein. Corresponding bonding adhesive 319 may be dispensed by PCS system 224 and/or other elements of fabrication system 220. Controller 212 may instruct FSAM system 110 to resume manufacture of forming structure 321 after bonding dielectric substrate 341 within cavity 331.

Method 602 may continue with block 634 by electrically coupling the circuit element 312 and/or the circuit 330 on the dielectric substrate 341 to a circuit 310 on a polymer substrate 311 that is conformed to a contoured surface 323 of forming structure 321. For example, controller 212 of fabrication system 220 may be configured to control FSAM system 110 to complete formation of forming structure 321, including embedded circuit element 312, circuit 330 on dielectric substrate 341, and/or any access holes configured to allow conductive vias 335 to be formed to electrically couple embedded circuit element 312 and/or circuit 330 on dielectric substrate 341 to circuit 310 and/or external circuitry. One or more contact pads 327 (e.g., of a conductive paste material and/or ink) may be formed on contoured surface 323 to contact one or more conductive traces 317 and/or circuit elements 312 of circuit 310.

In some embodiments, conductive vias 335 integrated within forming structure 321 may be formed, at least partially, by access holes formed by FSAM system 110 and filled with conductive ink and/or paste by PCS system 224. In other embodiments, PCS system 224 and/or FSAM system 110 may be configured to deposit conductive material layer by layer to form a conductive via extending from embedded circuit elements 312 and/or circuit 330 to contoured surface 323 at intermediate steps in the formation of forming structure 321. In related embodiments, PCS system 224 may be configured to deposit conductive ink and/or paste material on contoured surface 323 to form contact pads 327 to electrically couple to conductive vias 335. One or more contact pads 327 on contoured surface 323 may electrically couple to one or more polymer substrate conductive traces 317 when polymer substrate 311 is conformed and/or adhered to contoured surface 323 of forming structure 321. In this regard, embedded circuit elements 312 and/or circuit 330 may be electrically coupled to circuit 310 to form an integrated composite structure 320.

FIG. 6D illustrates a flow diagram 603 describing a method for forming a circuit 410 on a contoured surface 323 of a forming structure 321. Method 603 may begin with block 614 by forming a circuit 410 on a contoured surface 323 of forming structure 321 by forming a plurality of conductive traces 317 and/or one or more circuit elements 312 on contoured surface 323. For example, PCS system 224 and/or other subsystems 230 may be configured to form conductive traces 317 and/or circuit elements 312 on contoured surface 323 of forming structure 321. In some embodiments, PCS system 224 and/or other subsystems 230 may be configured to prepare contoured surface 323 of forming structure 321 by sanding and/or otherwise finishing a non-uniform and/or unfinished contoured surface 323 and/or depositing a layer of dielectric material over contoured surface 323 to fill voids and/or other manufacturing errors in forming contoured surface 323 by FSAM system 110.

PCS system 224 may be configured to use any of the methods described herein to form conductive traces 317 and/or circuit elements 312 on contoured surface 323. In this regard, PCS system 224 may be implemented as an extrusion, inkjet, aerosol jet deposition, and/or screen print system configured to receive polymer substrate material and conductive inks and/or pastes from preparation system 211 and dispense the conductive inks and/or pastes onto contoured surface 323 of forming structure 321 to form conductive traces 317 and/or circuit elements 312 of circuit 410. In some embodiments, PCS system 224 and/or other subsystems 230 may also be configured to use a screen printing method to apply bonding adhesive 319 on contoured surface 323 to bond one or more discrete circuit elements 312 to contoured surface 323.

Method 603 may continue with block 635 by electrically coupling circuit 410 on contoured surface 323 to circuit 310 on polymer substrate 311 that is conformed to the contoured surface 323 of the forming structure 321. For example, PCS system 224 may be configured to deposit bonding adhesive 325 on polymer substrate 311 and/or contoured surface 323 of forming structure 321 in an area where polymer substrate 311 will be bonded to forming structure 321. Integration system 226 and/or other subsystems 230 may be configured to prepare polymer substrate 311 and/or contoured surface 323 for bonding polymer substrate 311 to contoured surface 323 by providing a heat and/or other forms of activation energy to activate bonding adhesive 325.

Integration system 226 may be configured to apply environmental stress 333 to deform polymer substrate 311 to substantially conform and/or adhere polymer substrate 311 to contoured surface 323 of forming structure 321. In this regard, polymer substrate 311 may be thermally cycled by integration system 226 to make polymer substrate 311 pliable and/or increase its pliability. Further, integration system 226 may be configured to apply vacuum through openings 339 of forming structure 321 to help conform polymer substrate 311 to forming structure 321.

In various embodiments, one or more conductive traces 317 on polymer substrate 311 may electrically couple to one or more circuit 410 conductive traces 317 on contoured surface 323 when polymer substrate 311 is substantially conformed and/or adhered to contoured surface 323 of forming structure 321. For example, PCS system 224 and/or other elements of fabrication system 220 may be configured to place conductive ink and/or paste on circuit 410 and/or contact pads 327 so that circuit 410 is electrically coupled to circuit 310 when polymer substrate 311 is bonded to forming structure 321. In this regard, circuit 410 may be electrically coupled to circuit 310 during a single processing step used to conform polymer substrate 311 to contoured surface 323 and form integrated composite structure 320.

In some embodiments, protective coating 328 may optionally be applied to an exposed surface 316 of polymer substrate 311 to complete formation of integrated composite structure 320. Protective coating 328 may be any coating that provides a moisture and/or environmental barrier and may be applied by PCS system 224 and/or other subsystems 320.

In various embodiments, an integrated composite structure may be used to form a smart structure where circuits integrated within and/or on the integrated composite structure may be capable of physically responding to sensed environmental conditions such as, for example, providing a deflection or stress of a portion or surface of the integrated composite structure, changing the shape of the integrated composite structure, and/or changing other physical characteristics of the integrated composite structure. In some embodiments, such circuits may be configured to provide a temperature of the integrated composite structure and/or circuits formed within the integrated composite structure.

Embodiments of the present disclosure can thus provide efficient, compact, and reliable integrated composite structures as well as systems and methods used to manufacture such structures. Such embodiments may be used to assemble devices, vehicles, smart structures, and/or other structural components that have relatively high strength to weight ratios. Moreover, such embodiments are flexible and simple enough to allow for mobile fabrication of bespoke integrated composite structures, such as under circumstances of tactical deployment, changing environmental conditions, and fluid design needs.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice-versa.

Software in accordance with the present disclosure, such as non-transitory instructions, program code, and/or data, can be stored on one or more non-transitory machine readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

Embodiments described above illustrate but do not limit the invention. It should also be understood that numerous modifications and variations are possible in accordance with the principles of the invention. Accordingly, the scope of the invention is defined only by the following claims.

What is claimed is:

1. A method comprising:
   forming a circuit (310, 510) on a substantially flat polymer substrate (311, 511), wherein the polymer substrate is configured to deform when subjected to an environmental stress; and
   forming an integrated composite structure (320) comprising the polymer substrate and a forming structure (321, 521) comprising a contoured surface (323, 523) by:
      forming the forming structure comprising the contoured surface;
      providing the environmental stress to deform the polymer substrate to substantially conform the polymer substrate to the contoured surface of the forming structure; and
      adhering the polymer substrate to the contoured surface of the forming structure.

2. The method of claim 1, wherein:
   the circuit comprises a plurality of conductive traces (317) configured to electrically couple one or more circuit elements (312) to each other; and
   the forming the circuit comprises:
      forming the conductive traces on one or more surfaces (316) of the polymer substrate; and
      bonding the circuit elements to the conductive traces and/or the one or more surfaces of the polymer substrate.

3. The method of claim 2, wherein:
   the circuit elements comprise one or more strain gauges, antenna elements, sensors, actuators, transducers, analog circuit elements, and/or digital circuit elements; and
   the method further comprises cutting the polymer substrate to substantially conform to an outline of the contoured surface.

4. The method of claim 2, wherein:
   the polymer substrate comprises one or more layers (313) of a polymer material; and
   the forming the circuit comprises:
      forming at least one of the conductive traces and/or the circuit elements on one or more interstitial ones of the layers of the polymer material;
      forming one or more conductive vias (315) within the one or more interstitial layers to electrically couple the conductive traces and/or the circuit elements to each other; and
      bonding the one or more layers of the polymer material together to form the polymer substrate and the circuit.

5. The method of claim 1, wherein the environmental stress comprises one or more of thermal cycling, application of pressure, and/or application of vacuum.

6. The method of claim 1, further comprising forming the forming structure using an additive manufacturing (AM) system (110) and/or an electrical discharge machining system (230).

7. The method of claim 6, wherein the forming structure is formed using the AM system, and wherein the AM system comprises a binder jetting AM system, a directed energy deposition AM system, a material extrusion AM system, a material jetting AM system, a powder bed fusion AM system, a sheet lamination AM system, and/or a vat photopolymerization AM system.

8. The method of claim 6, wherein the forming the forming structure comprises adjusting an amount and/or pattern of material used in localized areas of the forming structure to adjust a rigidity and/or a weight of the localized areas of the forming structure.

9. The method of claim 6, wherein:
   the forming the forming structure comprises embedding one or more circuit elements (312) in the forming structure by forming a cavity (329) within the forming structure and bonding the one or more circuit elements within the cavity; and
   the forming the integrated composite structure comprises electrically coupling the one or more circuit elements within the cavity to the polymer substrate.

10. The method of claim 6, wherein the circuit comprises a first circuit, and wherein the forming the forming structure comprises embedding a second circuit (330) in the Ruining structure by:
   forming the second circuit on a substantially planar dielectric substrate (341);
   forming a substantially planar cavity (331) within the forming structure; and
   placing the dielectric substrate within the cavity, wherein the forming the integrated composite structure comprises electrically coupling the second circuit on the dielectric substrate to the first circuit on the polymer substrate.

11. The method of claim 1, wherein the forming the integrated composite structure comprises:
   applying a thermal and/or pressure sensitive bonding adhesive (325) to the contoured surface;
   activating the bonding adhesive;
   applying the environmental stress to substantially conform and adhere the polymer substrate to the contoured surface of the forming structure; and
   applying a protective coating (328) to an exposed surface (316) of the polymer substrate.

12. The method of claim 1, wherein the circuit comprises a first circuit, the method further comprising:
   forming a second circuit (410) on the contoured surface of the forming structure by forming a plurality of conductive traces (317) and/or one or more circuit elements (312) on the contoured surface, wherein:
      the conductive traces are configured to electrically couple the one or more circuit elements to each other; and
      the forming the integrated composite structure comprises electrically coupling the second circuit on the contoured surface to the first circuit on the polymer substrate.

13. A system comprising the integrated composite structure formed by the method of claim 1, the system comprising:
   the forming structure comprising the contoured surface;
   the circuit formed on the polymer substrate, wherein the circuit formed on the polymer substrate comprises a plurality of conductive traces (317) configured to electrically couple one or more circuit elements (312) to each other; and
   the integrated composite structure comprising the polymer substrate and the forming structure, wherein the polymer substrate has been deformed by the environmental stress to substantially conform the polymer substrate to the contoured surface of the forming structure, and wherein the polymer substrate has been adhered to the contoured surface of the forming structure to form the integrated composite structure.

14. The system of claim 13, wherein:
   the plurality of conductive traces and/or the one or more circuit elements are formed on one or more surfaces (316) of the polymer substrate;
   the circuit elements comprise one or more strain gauges, antenna elements, sensors, actuators, transducers, analog circuit elements, and/or digital circuit elements; and
   the polymer substrate substantially conforms to an outline of the contoured surface.

15. The system of claim 14, wherein:
   the polymer substrate comprises one or more layers (313) of a polymer material;
   at least one of the conductive traces and/or the circuit elements are formed on one or more interstitial ones of the layers of the polymer material;
   one or more conductive vias (315) are formed within the interstitial layers to electrically couple the conductive traces and/or the circuit elements; and
   the one or more layers of the polymer material are bonded together to form the polymer substrate and the circuit.

16. The system of claim 13, wherein:
   the forming structure is formed by an additive manufacturing (AM) system (110) and/or an electrical discharge machining system (230); and
   the AM system comprises a binder jetting AM system, a directed energy deposition AM system, a material extrusion AM system, a material jetting AM system, a powder bed fusion AM system, a sheet lamination AM system, and/or a vat photopolymerization AM system.

17. The system of claim 16, wherein:
   the forming structure comprises a plurality of localized areas within the forming structure each with a rigidity and/or a weight selected by adjusting an amount and/or pattern of material used by the AM system in forming the localized areas of the forming structure.

18. The system of claim 13, wherein:
   the forming structure comprises one or more embedded circuit elements (312) bonded within a cavity (329) formed in the forming structure; and
   the one or more embedded circuit elements are electrically coupled to the circuit formed on the polymer substrate.

19. The system of claim 13, wherein:
   the circuit comprises a first circuit and the forming structure comprises a second circuit (410) formed on the contoured surface of the forming structure;
   the second circuit comprises a plurality of conductive traces (317) and/or one or more circuit elements (312); and
   the second circuit on the contoured surface is electrically coupled to the first circuit formed on the polymer substrate.

20. The system of claim 13, wherein:
   the forming structure comprises an embedded circuit (330) bonded within a cavity (331) formed in the forming structure;
   the embedded circuit is formed on a substantially planar dielectric substrate (341); and
   the embedded circuit is electrically coupled to the circuit formed on the polymer substrate.

21. A method of forming an integrated composite structure (320) comprising a polymer substrate (311, 511) and a forming structure (321, 521) comprising a contoured surface (323, 523), the method comprising:
   forming the forming structure comprising the contoured surface;
   placing the polymer substrate adjacent to the contoured surface of the forming structure;
   applying a thermal and/or pressure sensitive bonding adhesive (325) to the contoured surface of the forming structure;
   providing an environmental stress to deform the polymer substrate and substantially conform the polymer substrate to the contoured surface, wherein the environmental stress comprises one or more of thermal cycling, application of pressure, and/or application of vacuum;
   adhering the polymer substrate to the contoured surface of the forming structure; and
   applying a protective coating (328) to an exposed surface (316) of the polymer substrate.

* * * * *

UNITED STATES PATENT AND TRADEMARK OFFICE
CERTIFICATE OF CORRECTION

| | | |
|---|---|---|
| PATENT NO. | : 9,801,276 B2 | Page 1 of 1 |
| APPLICATION NO. | : 14/952886 | |
| DATED | : October 24, 2017 | |
| INVENTOR(S) | : Scott R. Johnston and Sergio H. Sanchez | |

It is certified that error appears in the above-identified patent and that said Letters Patent is hereby corrected as shown below:

On the Title Page

Item (54), and in the Specification, in Column 1, Line 1, change "METHOF OF FORMING AN INTEGRATED" to --METHOD OF FORMING AN INTEGRATED--.

Signed and Sealed this
Twenty-sixth Day of June, 2018

Andrei Iancu
*Director of the United States Patent and Trademark Office*